United States Patent [19]
Lee

[11] Patent Number: 5,721,511
[45] Date of Patent: Feb. 24, 1998

[54] PWM VARIABLE VOLTAGE LOAD DRIVER

[75] Inventor: Nai-Chi Lee, Peekskill, N.Y.

[73] Assignee: Philips Electronics North America Corporation, New York, N.Y.

[21] Appl. No.: 674,073

[22] Filed: Jul. 1, 1996

[51] Int. Cl.$^6$ .................. H03K 3/00; G05F 1/10
[52] U.S. Cl. .................. 327/540; 327/110; 327/172; 318/599
[58] Field of Search .................. 327/538, 540, 327/541, 543, 172, 175, 176, 177, 108, 109, 110, 65, 67; 318/599; 388/804, 803, 810, 811; 332/109, 110

[56] References Cited

U.S. PATENT DOCUMENTS

| | | | |
|---|---|---|---|
| 3,446,992 | 5/1969 | Webb | 307/265 |
| 4,820,940 | 4/1989 | Wachi et al. | 327/110 |
| 5,406,071 | 4/1995 | Elms | 327/35 |
| 5,406,150 | 4/1995 | Austin | 327/110 |
| 5,430,405 | 7/1995 | Cohen | 327/581 |
| 5,541,543 | 7/1996 | Arnaud | 327/172 |

FOREIGN PATENT DOCUMENTS

| | | | |
|---|---|---|---|
| 4408442A1 | 9/1995 | Germany | H02P 5/17 |
| 59-11795 | 1/1984 | Japan | H02P 7/28 |
| 60-128882 | 7/1985 | Japan | H02P 5/06 |
| 63-95886 | 4/1988 | Japan | H02P 7/29 |
| 421393 | 1/1992 | Japan | H02P 7/29 |

Primary Examiner—Toan Tran
Attorney, Agent, or Firm—Robert J. Kraus

[57] ABSTRACT

A pulse width modulation driver is capable of regulating the average voltage applied to a load that is powered from a source having a wide range, e.g. 20 to 80 volts DC, of possible voltages. The driver cyclically interrupts the load current at a frequency which is substantially constant. This is particularly advantageous for driving frequency-sensitive loads such as motors.

5 Claims, 3 Drawing Sheets

PWM VARIABLE VOLTAGE LOAD DRIVER

BACKGROUND OF THE INVENTION

1. Field of the Invention

This invention relates to pulse width modulation (PWM) driving of a load that is powered by a variable voltage DC power source.

2. Description of Related Art

U.S. Pat. No. 3,446,992 describes a PWM circuit for driving a load from a DC voltage power source, while automatically compensating for fluctuations in the supplied voltage. This circuit includes a relaxation oscillator that applies output pulses to a monostable multivibrator which, in turn, applies pulses to a switching transistor connected in series with a motor winding and a DC power source. The oscillator output pulses control the frequency at which the multivibrator produces output pulses. This frequency varies inversely with variations of the power source voltage, which voltage is applied to the oscillator as a feedback signal. The widths of the pulses produced by the multivibrator are controlled in response to an input signal and variations of the power source voltage, which voltage is also applied to the multivibrator as a feedback signal.

While PWM circuits such as that described in U.S. Pat. No. 3,446,992 might well compensate for variations in a known, substantially constant power source voltage, in some applications compensation must be provided over a wide range of power source voltages. An example is the driving of a motor for operating a remotely located circuit breaker. Such circuit breakers are used, for example, at remote cites in geographically large telecommunications systems, where different power source voltages are provided or where the power source voltages are subject to severe changes, e.g. greater than 2:1. Additionally, there are applications in which it is desirable to maintain the modulation frequency of the current pulses through the load substantially constant over a predetermined range of power source voltages. An example is in the driving of inductive loads such as motors where the modulation frequency preferably is large in comparison to the frequency of operation of the load, but not so large as to cause intolerable power losses in PWM switches.

SUMMARY OF THE INVENTION

It is an object of the invention to provide a pulse width modulation apparatus for driving a load at a substantially constant pulse energy, even with large fluctuations in a known voltage for powering the load.

It is another object of the invention to provide a pulse width modulation apparatus for driving a load at a substantially constant pulse energy over a wide range of different voltages for powering the load.

It is yet another object of the invention to provide a pulse width modulation apparatus which is capable of driving a load at a substantially constant pulse frequency despite substantial fluctuations in a voltage for powering the load.

As used in this application, the term variable voltage power source is defined as a power source which provides a fluctuating voltage and/or provides one of a range of different voltages.

In accordance with the invention, a pulse width modulation driver comprises power switching means electrically connected in series with a load for controllably interrupting current supplied to the load by a variable voltage power source, comparator means for producing output signals for controlling the power switching means in response to timing signals, and first and second timing circuits for producing the timing signals. The comparator means includes a first output electrically connected to a control input of the power switching means, a second output, and first and second inputs.

The comparator means alternately produces at the first output:

an ON signal, for placing the power switching means in a closed state, in response to application to the first input of a signal having a first predetermined voltage; and an OFF signal, for placing the power switching means in an open state, in response to application to the second input of a signal having a second predetermined voltage.

The first timing circuit includes:

a first capacitance electrically connected to the first input of the comparator means;

a control input electrically connected to the first output of the comparator means;

first resistive charging means electrically connected to the power source for charging the first capacitance substantially simultaneously with a respective closed state of the power switching means; and first resistive discharging means for discharging the first capacitance, beginning upon the occurrence of a respective open state of the power switching means, to the first predetermined voltage, thereby effecting production by the comparator means of the ON signal.

The second timing circuit includes:

a second capacitance electrically connected to the second input of the comparator means;

a control input electrically connected to the second output of the comparator means;

second resistive charging means electrically connected to the power source for charging the second capacitance, substantially simultaneously with the respective closed state of the power switching means, to the second predetermined voltage, thereby effecting production by the comparator means of the OFF signal; and means for discharging the second capacitance to a predetermined voltage during the open state of the power switching means.

DESCRIPTION OF THE PREFERRED EMBODIMENT

Figure 1:
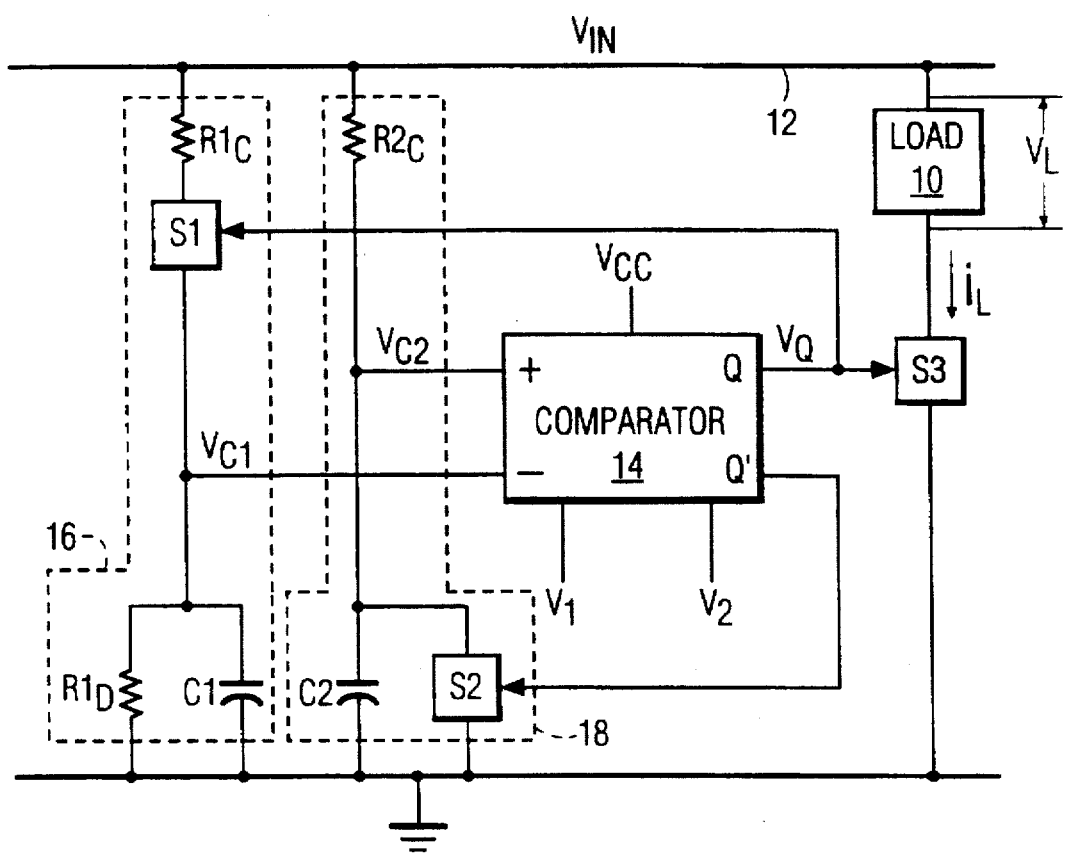
FIG. 1 is a block diagram illustrating an embodiment of a power system including a pulse width modulation driver in accordance with the invention.

FIG. 1 illustrates a power system including a load 10, a power bus 12 for providing power from a variable voltage source (not shown), and a pulse width modulation driver in accordance with a preferred embodiment of the invention. The pulse width modulation driver includes a controllable power switch S3 that is electrically connected in series with the load 10, a comparator 14 having a memory capability, a first timing circuit 16, and a second timing circuit 18.

The power switch S3 provides a path to system ground for current flow through the load 10. This switch has a control input that is electrically connected to a Q output of the comparator 14 and assumes a closed state only when the comparator produces an ON signal at the Q output.

The comparator 14 has an inverting input (−), a non-inverting input (+), the Q output, a Q' output, and inputs for three regulated DC voltages that are provided by conventional voltage regulator circuitry (not shown) that is powered by the bus 12. These voltages are a voltage $V_{CC}$ for powering the comparator, a first reference voltage $V_1$ and a second reference voltage $V_2$. Functionally, the comparator produces at the Q output:

- a first DC voltage, designated as the ON signal, whenever a voltage lower than $V_1$ is applied to the inverting input (−);
- a second DC voltage, designated as an OFF signal, whenever voltages greater than $V_1$ and $V_2$ are applied simultaneously to the inverting and non-inverting inputs, respectively;
- the last existing signal (ON or OFF), whenever a voltage greater than $V_1$ is applied to the inverting input (−) simultaneously with the application of a voltage lower than $V_2$ to the non-inverting input (+).

The Q' output always produces the opposite of the signal being produced at the Q output.

The first timing circuit 16 includes a controllable timer switch S1 that is electrically connected in series with a resistor $R1_C$ and the parallel combination of a capacitor C1 and a resistor $R1_D$. This entire circuit is electrically connected between the power bus 12 and ground. A control input of the switch is electrically connected to the Q output of the comparator 14 and one plate of the capacitor is electrically connected to the inverting input (−) of the comparator. Functionally, the switch S1 controls charging and discharging of the capacitor C1 in accordance with the existing signal being produced at the Q output of the comparator. Whenever an ON signal is being produced, indicating that power switch S3 is closed, timer switch S1 assumes a corresponding closed state and capacitor C1 charges, via switch S1 and resistor $R1_C$, toward whatever voltage $V_{IN}$ is currently being supplied by the variable voltage source. When the signal at the Q output changes to the OFF state, indicating that the power switch S3 has opened and interrupted current flow through the load, timer switch S1 opens and allows capacitor C1 to discharge through resistor $R1_D$.

The second timing circuit 18 includes a resistor $R2_C$ that is electrically connected in series with the parallel combination of a capacitor C2 and a controllable timer switch S2. This entire circuit is also electrically connected between the power bus 12 and ground. A control input of switch S2 is electrically connected to the Q' output of the comparator 14. One plate of the capacitor C2 is electrically connected to the non-inverting input (+) of the comparator. Functionally, switch S2 controls charging and discharging of the capacitor C2 in synchronism with, but differently than, the similar functions effected by switch S1. Whenever an ON signal is being produced at the Q output of the comparator, indicating that power switch S3 is closed, the opposite OFF signal, being produced at the Q' output, causes timer switch S2 to assume an open state and capacitor C2 charges, via resistor $R2_C$, toward whatever voltage $V_{IN}$ is currently being supplied by the variable voltage source. When the signal at the Q output changes to the OFF state, indicating that the power switch S3 has opened and interrupted current flow through the load, the opposite ON signal at the Q' output causes timer switch S2 to close and substantially instantly discharge capacitor C2 to 0 volts.

Figure 2A:
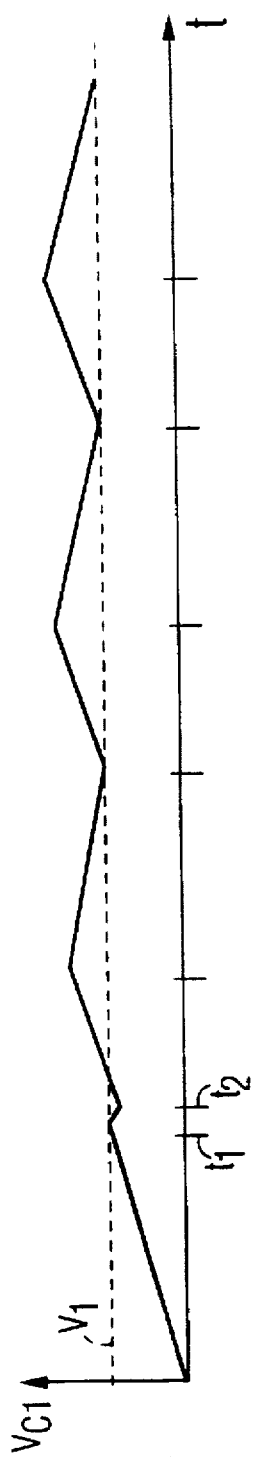
FIGS. 2(a)–2(d) are a timing diagram illustrating a operation of the pulse width modulation driver of FIG. 1.
Figure 2B:
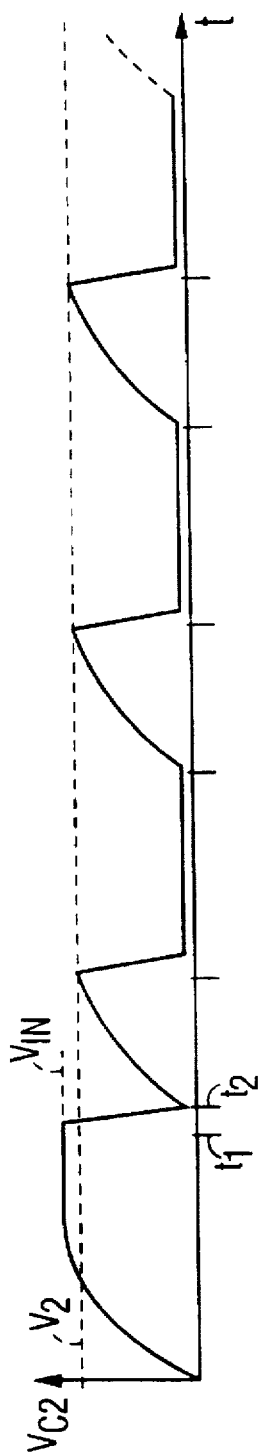
Figure 2C:
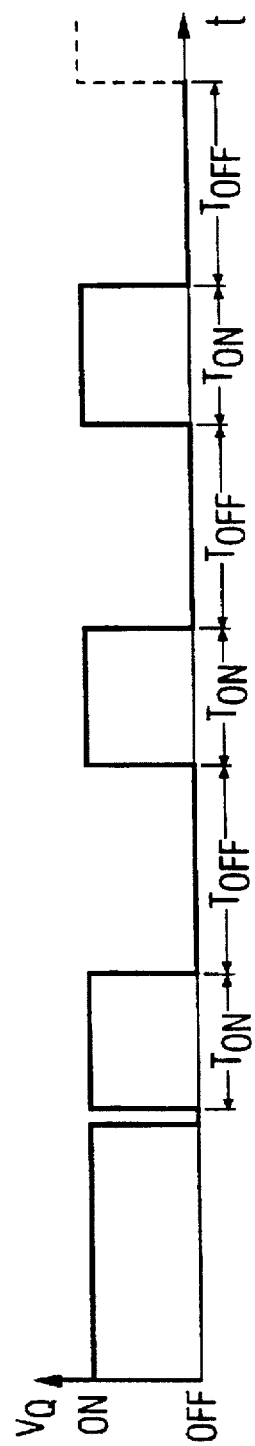

Operation of the exemplary pulse width modulation driver illustrated in FIG. 1 can be better understood with the aid of the timing diagram of FIG. 2. This diagram includes plots of voltage versus time for significant signals, identified in FIG. 1, that are occurring simultaneously in the driver circuitry. These plots are idealized and are not drawn to scale, but generally illustrate the shapes and timing relationships of the different signals. Specifically, in the timing diagram:

FIG. 2a illustrates the voltage $v_{C1}$ on the plate of capacitor C1 that is electrically connected to the inverting input (−) of the comparator 14;

FIG. 2b illustrates the voltage $v_{C2}$ on the plate of capacitor C2 that is electrically connected to the non-inverting input (+) of the comparator 14;

FIG. 2c illustrates the voltage $v_Q$ at the Q output of the comparator 14; and

Figure 2D:
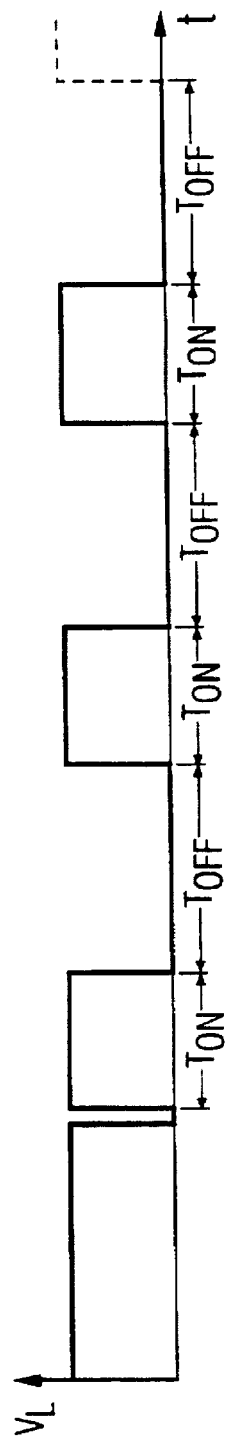

FIG. 2d illustrates the voltage $v_L$ across the load 10.

The relatively few cycles of operation of the pulse width modulation driver circuitry of FIG. 1, that are illustrated in FIG. 2, show both initial and steady state operation of the circuitry.

When the variable voltage $V_{IN}$ is initially applied to the bus 12, the voltage $v_{C1}$ and $v_{C2}$ on capacitors C1 and C2 are at ground potential. In this situation, because $v_{C1}$ is lower than $V_1$, comparator 14 produces the ON signal at the Q output, causing power switch S3 to close and enable the full voltage $V_{IN}$ to be dropped across the load 10 as it draws current from power bus 12. The ON signal also causes switch S1 to close, enabling capacitor C1 to charge toward $V_{IN}$ through resistor $R1_C$. Simultaneously, the comparator produces the opposite OFF signal at its Q' output, causing switch S2 to open, thereby enabling capacitor C2 to charge toward $V_{IN}$ through resistor $R2_C$.

The values of $R2_C$, C2, and $V_2$ are chosen to determine the duration of each ON signal, during steady-state operation, for any given source voltage $V_{IN}$. Conversely, the values of $R1_C$, C1, and $V_1$ are chosen to determine the duration of each OFF signal, during steady-state operation, for any given source voltage $V_{IN}$. All of these values must further be chosen to ensure that the duration of the initial ON state does not cause the initial power dissipated by the load to exceed its rated limits. Note, for example, that in the exemplary embodiment operating in accordance with the diagram of FIG. 2 the duration of the initial ON signal is determined by the values of $R1_C$, C1, and $V_1$. This occurs because a relatively long charging time constant has been chosen for the first timer circuit 16 in comparison to that chosen for the second timer circuit 18. Consequently, capacitor C1 does not charge to the voltage $V_1$ until a time $t_1$, which occurs well after a time when capacitor C2 has charged beyond the voltage $V_2$ and to the voltage $V_{IN}$. A benefit of choosing the values such that the first timing circuit 16 has a substantially longer charging time constant than the second timing circuit 18 is that, in the case of a load such as a motor, the longer initial ON state will generate a higher startup torque.

At time $t_1$, the comparator 14 changes the states of the signals at its Q and Q' outputs, at which it momentarily produces OFF and ON signals, respectively. This causes capacitor C1 to slowly discharge toward ground potential, through resistor $R1_D$, and causes capacitor C2 to rapidly discharge to ground through switch S2. However, as soon as the comparator senses that the voltage $v_{C1}$ on capacitor C1 has dropped below the voltage $V_1$, i.e. at time $t_2$, the comparator again changes the states of its output signals. At this time, steady state operation begins.

Each cycle of steady state operation of the pulse width modulation driver includes an ON period of duration $T_{ON}$ and on OFF period of duration $T_{OFF}$. The duration of each ON period, which is determined by the time it takes for capacitor C2 to charge to the voltage $V_2$, is inversely related to the magnitude of the power source voltage $V_{IN}$. This results from the fact that C2 charges more quickly toward the fixed reference voltage $V_2$ if the source voltage is increased. Conversely, the duration of each OFF period, which is determined by the time it takes for capacitor C1 to discharge to the voltage $V_1$, is directly related to the magnitude of the power source voltage. This results from the fact that C1 charges to a higher voltage if the source voltage is increased, and this increases the amount of discharge time, through resistor $R1_D$, that is needed to reach the fixed reference voltage $V_1$. Thus, as the source voltage $V_{IN}$ increases, the percentage of ON time during each cycle decreases, thereby maintaining the average voltage across the load 10 substantially constant.

In the opposite situation, i.e. if the source voltage decreases, the opposite result occurs. In this situation, C2 charges more slowly causing the duration $T_{ON}$ to increase, C1 charges to a lower voltage causing the duration $T_{OFF}$ to decrease, and the percentage of ON time during each cycle increases. This operation similarly maintains the average voltage across the load substantially constant.

Note that the durations of both the ON and OFF periods are primarily influenced by the magnitude of the source voltage. Thus the sum of these two periods, i.e. $T_{ON}+T_{OFF}$, tends to be a constant number, at least over a substantial range of different source voltage magnitudes. As a consequence, the PWM driver also maintains the repetition rate or frequency of the cycles substantially constant.

Figure 3:
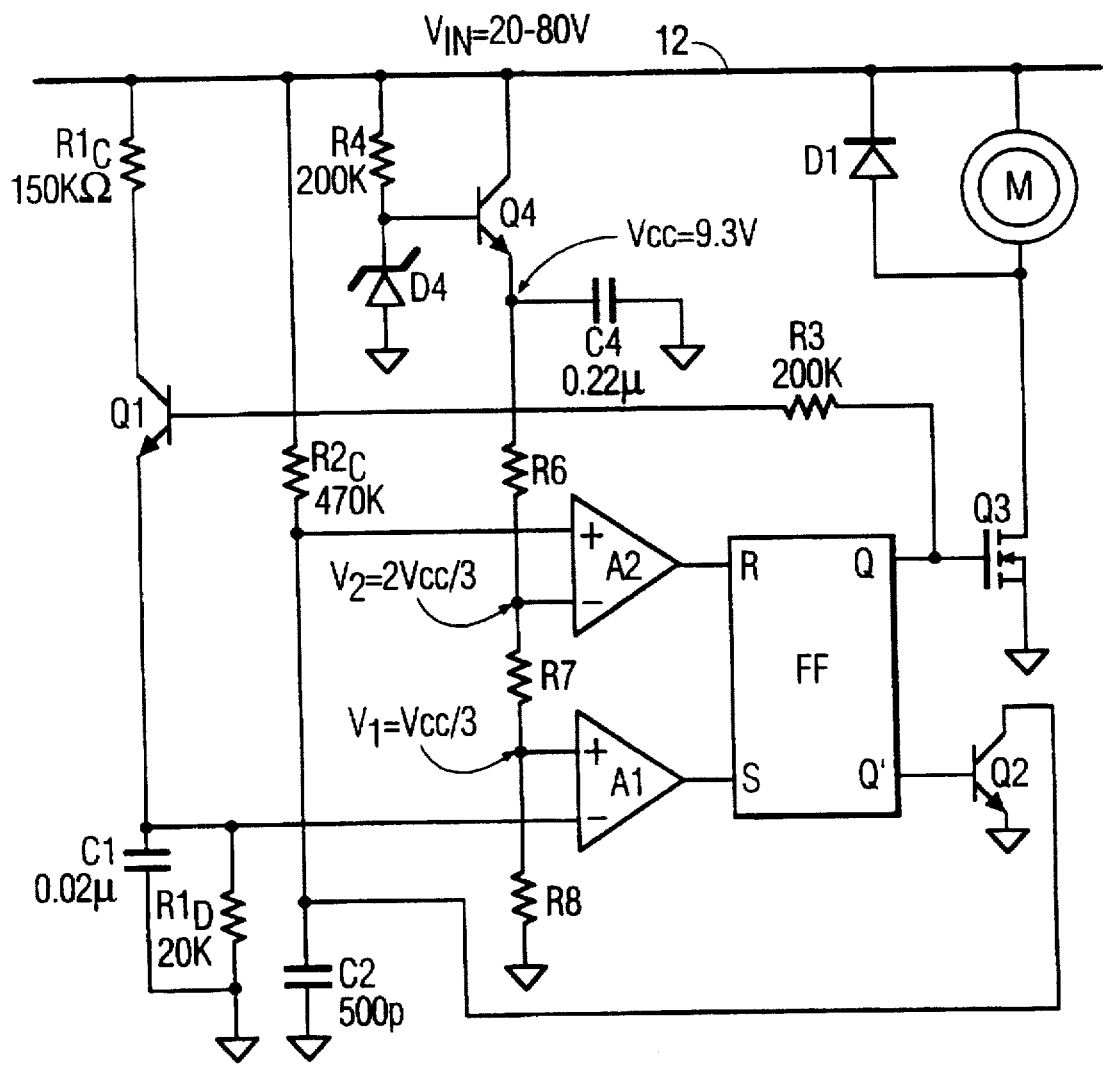
FIG. 3 is a schematic illustration of an embodiment of a circuit which may be used to implement the pulse width modulation driver of FIG. 1.

FIG. 3 illustrates a power system for load comprising a DC motor and includes a specific PWM driver circuit of the type depicted in FIG. 1. In this particular example, the motor M is rated to operate at a nominal voltage of 23 volts DC, but must be capable of operating over a range of power source voltages $V_{IN}$ that can vary from 20 to 80 volts DC. A diode D1 is electrically connected across the motor terminals to discharge the motor back electro-motive force (EMF) each time current through the motor is switched off by the power switch in the PWM driver circuit. The controllable power switch is in the form of a field effect transistor Q3 having a gate terminal connected to the Q output of the comparator for providing the ON and OFF signals.

The comparator includes first and second differential amplifiers A1 and A2, respectively, and an RS flip flop FF. The Q and Q' outputs of the flip flop serve as the corresponding outputs of the comparator. An inverting input (−) of amplifier A1 serves as the inverting input of the comparator, while a non-inverting input of amplifier A2 serves as the non-inverting input of the comparator.

A conventional voltage regulator circuit is provided for producing the voltage $V_{CC}$ for powering the amplifiers A1, A2 and the flip flop FF. This voltage regulator circuit includes an NPN transistor Q4, and a series combination of a resistor R4 and a 10 volt zener diode D4. The base terminal of the transistor, the cathode terminal of the zener diode, and one terminal of the resistor are connected at a common junction. The other terminal of the resistor and the collector terminal of the transistor are connected to the 20–80 VDC power bus, while the anode terminal of the zener diode is connected to ground.

The emitter terminal of the transistor Q4, which provides the voltage $V_{CC}$, is connected to ground via a filtering capacitor C4. Although not shown in FIG. 3, this emitter terminal is also connected to power terminals of the differential amplifiers A1,A2 and of the RS flip flop FF.

The emitter terminal of the transistor Q4 is further connected to ground through a conventional resistive voltage divider including three serially connected resistors R6, R7 and R8. In this embodiment, the resistors have equal resistances and produce, at respective connecting junctions, the reference voltages $V_1=\frac{1}{3}V_{CC}$ and $V_2=\frac{2}{3}V_{CC}$. The junction at which reference voltage $V_1$ is produced is connected to a non-inverting input of amplifier A1, while the junction at which reference voltage $V_2$ is produced is connected to an inverting input of amplifier A2.

The first timing circuit in the embodiment of FIG. 3 includes an NPN switching transistor Q1, the resistor $R1_C$, the capacitor C1 and the resistor $R1_D$, all connected as in FIG. 1. The collector of the transistor is connected to the power buss 12 through the resistor $R1_C$ and the emitter of the transistor is connected to ground through the parallel combination of the capacitor C1 and the resistor $R1_D$. The base of switching transistor Q1, which serves as the control input, is connected to the Q output of the flip flop through a current limiting resistor R3.

The second timing circuit in FIG. 3 includes the resistor $R2_C$, the capacitor C2, and an NPN switching transistor Q2, all connected as in FIG. 1. The collector of the transistor is connected to the positive terminal of the capacitor and the emitter is connected to ground. The base of the switching transistor Q1, which serves as the control input, is connected to the Q' output of the flip flop FF.

The PWM driver circuit of FIG. 3 operates as was described with respect to FIGS. 1 and 2. Specific operating characteristics include the application to the load of an average voltage of 23 volts by producing a duty cycle, i.e. $[T_{ON}]+[T_{ON}+T_{OFF}]$, that is approximately equal to 30% for $V_{IN}=80$ volts DC, 50% for $V_{IN}=48$ volts DC, and 100% for $V_{IN}=23$ volts DC or less. The nominal period $[T_{ON}+T_{OFF}]$ for this circuit is approximately 50 microseconds.

I claim:

1. A pulse width modulation driver for a load powered by a power source which produces a variable voltage, said driver comprising:

a. power switching means electrically connected in series with the load for controllably interrupting current supplied to said load by the power source, said means including a control input;

b. comparator means including a first output electrically connected to the control input of the power switching means, a second output, and first and second inputs, said comparator means alternately producing at said first output:

i. an ON signal, for placing said power switching means in a closed state, in response to application to the first input of a signal having a first predetermined voltage;

ii. an OFF signal, for placing said power switching means in an open state, in response to application to the second input of a signal having a second predetermined voltage;

c. a first timing circuit including:

i. a first capacitance electrically connected to the first input of the comparator means;

ii. a control input electrically connected to the first output of the comparator means;

iii. first resistive charging means electrically connected to the power source for charging the first capacitance substantially simultaneously with a respective closed state of the power switching means;

iv. first resistive discharging means for discharging the first capacitance, beginning upon the occurrence of a respective open state of the power switching means, to the first predetermined voltage, thereby effecting production by the comparator means of the ON signal;

d. a second timing circuit including:

i. a second capacitance electrically connected to the second input of the comparator means;

ii. a control input electrically connected to the second output of the comparator means;

iii. second resistive charging means electrically connected to the power source for charging the second capacitance, substantially simultaneously with said respective closed state of the power switching means, to the second predetermined voltage, thereby effecting production by the comparator means of the OFF signal;

iv. means for discharging the second capacitance to a predetermined voltage during the open state of the power switching means.

2. A pulse width modulation driver in claim 1, where the lead is inductive.

3. A pulse width modulation driver in claim 1 where the first timing circuit includes first switching means electrically connected in series with the first resistive charging means, said first switching means assuming a closed state during the existence of the ON signal at the control input of said first timing circuit.

4. A pulse width modulation driver in claim 3 where the second timing circuit includes second switching means electrically connected in parallel with the second capacitance, said second switching means assuming a closed state during the existence of the OFF signal at the control input of said second timing circuit.

5. A pulse width modulation driver in claim 1 where the load comprises a DC motor.

* * * * *